United States Patent
Hwang et al.

(10) Patent No.: US 9,151,779 B2
(45) Date of Patent: Oct. 6, 2015

(54) RECONFIGURABLE ELECTRIC FIELD PROBE

(71) Applicant: QUALCOMM Incorporated, San Diego, CA (US)

(72) Inventors: Kyu-Pyung Hwang, San Diego, CA (US); Young K Song, San Diego, CA (US); Changhan Hobie Yun, San Diego, CA (US); Dong Wook Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 288 days.

(21) Appl. No.: 13/675,673

(22) Filed: Nov. 13, 2012

(65) Prior Publication Data

US 2014/0132297 A1    May 15, 2014

(51) Int. Cl.
*G01R 31/00* (2006.01)
*G01R 1/07* (2006.01)

(52) U.S. Cl.
CPC .............. *G01R 1/07* (2013.01); *G01R 31/002* (2013.01)

(58) Field of Classification Search
CPC ....... G01Q 60/04; G01Q 70/10; G01Q 60/06; G01Q 30/02; G01Q 40/00; G01N 30/7266; G01N 27/82; G01N 33/54326; H01P 3/12; H01P 3/127; H01P 5/103; H01P 5/12; H01P 5/18; H01P 1/065; H01P 1/165; H01P 5/107; G11B 7/1208; G11B 11/1058; G11B 7/1203; G11B 9/02; G11B 9/08; G11B 9/14; G11B 33/122; G11B 33/12; G01V 3/088; G01R 1/07; G01R 33/093–33/12; G01R 1/06722; G01R 31/002; G01R 31/2891; G01R 29/0878; G01R 31/2886; G01R 1/06772; G01R 29/0892; H01R 13/65802; H01R 13/50; H01R 13/506; H01R 13/514; H01R 13/518; H01R 13/6315; H01R 13/641; H01R 31/06; H01R 4/64; H01R 13/62; H01R 13/6275; H01R 13/6461; H01R 13/6477; H01R 23/688; G01L 1/148

See application file for complete search history.

(56) References Cited

U.S. PATENT DOCUMENTS

| | | | |
|---|---|---|---|
| 5,153,472 A | 10/1992 | Karidis et al. | |
| 5,844,251 A * | 12/1998 | MacDonald et al. | 257/10 |
| 6,532,806 B1 * | 3/2003 | Xiang et al. | 73/105 |
| 6,700,397 B2 | 3/2004 | Hollman et al. | |
| 7,280,435 B2 | 10/2007 | Thomenius et al. | |
| 7,492,147 B2 | 2/2009 | Schwindt et al. | |
| 7,554,352 B2 | 6/2009 | Huie | |
| 8,415,943 B2 * | 4/2013 | Dijkstra et al. | 324/149 |

\* cited by examiner

*Primary Examiner* — Vinh Nguyen

(57) ABSTRACT

Systems and methods for EMC, EMI and ESD testing are described. A probe comprises a center conductor extending along an axis of the probe, a probe tip, and a shield coaxially aligned with the center conductor and configured to provide electromagnetic screening for the probe tip. One or more actuators may change the relative positions of the probe tip and shield with respect to a device under test, thereby enabling control of sensitivity and resolution of the probe.

36 Claims, 7 Drawing Sheets

RECONFIGURABLE ELECTRIC FIELD PROBE

BACKGROUND

1. Field

The present disclosure relates generally to electromagnetic testing of devices, and in particular to a probe that may be used for electromagnetic compatibility testing.

2. Background

It is generally desirable and/or necessary to characterize electromagnetic radiation emanating from an integrated circuit (IC) device for the purpose of identifying potential sources of interference with other IC devices, whether collocated within the same IC package, carrier, circuit board, device and/or system, or located in a different device or system. For example, manufacturers of wireless communication devices typically attempt to identify sources of stray radio frequency signals generated by the wireless communication devices. Electromagnetic interference (EMI) and electromagnetic compatibility (EMC) testing may be performed during design and development of devices and systems and during certain manufacturing processes. However, conventional systems lack an ability to easily and quickly target areas of interest on a device under test (DUT).

SUMMARY

Certain embodiments disclosed herein provide a method and apparatus for performing EMC testing. In some embodiments, a center conductor extends along an axis of the EMC probe and has a probe tip at one end. A shield extending along the axis is coaxially aligned with the center conductor and is configurable to provide variable electromagnetic screening for the probe tip. At least one actuator is configured to axially translate the probe tip and/or the shield and thereby change the position of the probe tip relative to the shield. Some embodiments comprise a substantially cylindrical housing surrounding the shield and the center conductor, and a dielectric disposed between the shield and the center conductor.

In some embodiments, the at least one actuator moves the probe tip along the axis such that a first distance measured between the probe tip and a DUT is changed while a second distance measured between the shield and the DUT remains unchanged. In some embodiments, the at least one actuator moves the shield in a direction parallel to the center conductor without moving the probe tip, such that a first distance measured between the shield and a DUT is changed. In some embodiments, the at least one actuator comprises one or more of an actuator operative to move the probe tip along the axis such that a first distance measured between the probe tip and the DUT is increased or decreased, and an actuator that moves the shield in a direction parallel to the center conductor such that a second distance measured between the shield and a DUT is changed.

In some embodiments, the probe tip is adapted to detect an electric field proximate to an area of interest on a surface of the DUT. In some embodiments, the first distance is selected to obtain a desired sensitivity of the EMC probe to the electric field. In some embodiments, the second distance determines size of the area of interest. In some embodiments, the probe tip is adapted to create an electric field proximate to an area of interest on a surface of the DUT. In some embodiments, the first distance is selected to control the strength of the electric field. In some embodiments, the second distance determines size of the area of interest.

In some embodiments, the EMC probe is adapted to measure electromagnetic radiation detected by the probe tip. In some embodiments, the first distance is selected to obtain a desired sensitivity of the EMC probe to the electromagnetic radiation. In some embodiments, the second distance determines size of the area of interest. In some embodiments, the EMC probe is adapted to transmit electromagnetic radiation through the probe tip toward an area of interest on a surface of the DUT. In some embodiments, the first distance is selected to control power of the electromagnetic radiation at the area of interest. In some embodiments, the second distance determines size of the area of interest.

In some embodiments, the at least one actuator is controlled by a computing device. In some embodiments, the at least one actuator comprises one or more of an electromechanical actuator, a hydraulic actuator, an electrostatic actuator, and a solenoid. In some embodiments, the EMC probe is one of a plurality of collocated probes, wherein two or more of the collocated probes target different areas of a DUT. In some embodiments, the collocated probes include an array of probes. In some embodiments, the collocated probes comprise micro-electromechanical system (MEMS) actuators provided on a semiconductor device.

In some embodiments, a method for EMC testing comprises positioning a probe proximate to a DUT, targeting an area of interest on the DUT by adjusting a geometry between the probe tip and the shield, and performing at least one EMC test on the DUT. In some embodiments, the probe comprises a center conductor extending along an axis of the probe and having a probe tip at one end and a shield coaxially aligned with the center conductor and configured to provide electromagnetic screening for the probe tip.

In some embodiments, targeting the area of interest includes selecting the extent of the area of interest and adjusting the shield to electromagnetically screen the probe tip from electrical fields outside the area of interest. In some embodiments, adjusting the shield includes moving the shield in a direction parallel to the center conductor. In some embodiments, the method comprises adjusting sensitivity of the probe by axially translate the probe tip or the shield and thereby change the position of the probe tip relative to the shield.

In some embodiments, the method comprises controlling one or more actuators to select the geometry between the probe tip and the shield. In some embodiments, each of the one or more actuators is operative to move the shield in the direction parallel to the center conductor, or is operative to axially translate the probe tip. In some embodiments, the one or more actuators comprise one or more of an electromechanical actuator, a hydraulic actuator, an electrostatic actuator, and a solenoid.

In some embodiments, the at least one EMC test is performed by measuring an electric field proximate to the area of interest. In some embodiments, the at least one EMC test is performed by creating an electric field proximate to the area of interest. In some embodiments, the at least one EMC test is performed by measuring an electromagnetic radiation emanating from the area of interest. In some embodiments, the at least one EMC test is performed by transmitting electromagnetic radiation toward the area of interest. In some embodiments, the at least one EMC test is performed by creating an electrostatic discharge event proximate to the area of interest.

DETAILED DESCRIPTION

Figure 1:
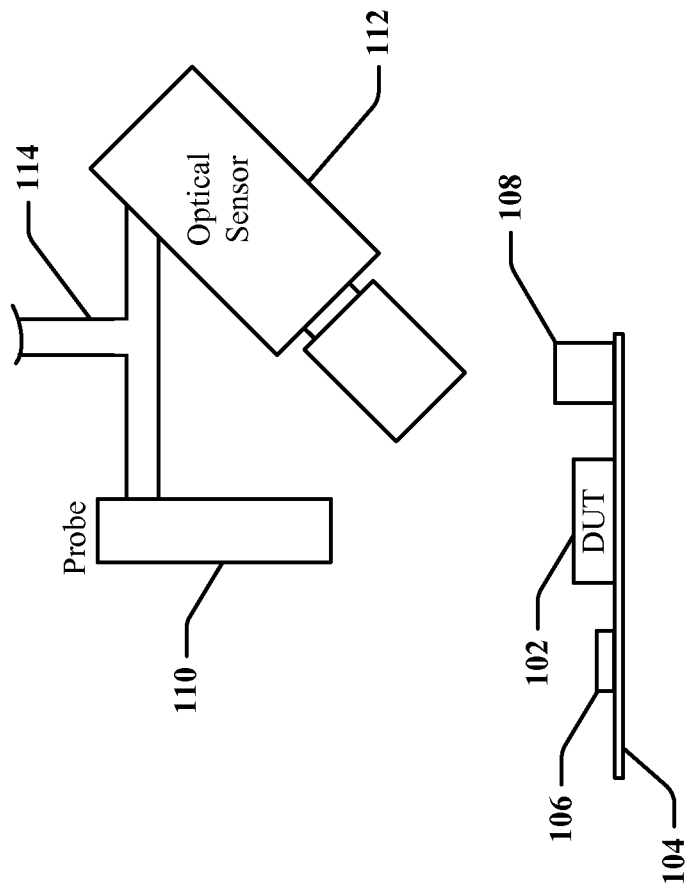
FIG. 1 illustrates a system adapted to perform EMC testing.

Various aspects are now described with reference to the drawings. In the following description, for purposes of explanation, numerous specific details are set forth in order to provide a thorough understanding of one or more aspects. It may be evident however, that such aspect(s) may be practiced without these specific details.

As used in this application, the terms "component," "module," "system" and the like are intended to include a computer-related entity, such as, but not limited to hardware, firmware, a combination of hardware and software, software, or software in execution. For example, a component may be, but is not limited to being, a process running on a processor, a processor, an object, an executable, a thread of execution, a program and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets, such as data from one component interacting with another component in a local system, distributed system, and/or across a network such as the Internet with other systems by way of the signal.

Furthermore, the term "or" is intended to man an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

According to certain aspects of the present invention, near-field scanning systems may be used for on-chip/on-package EMC analysis in commercial production environments. In certain embodiments of the invention, a probe is provided that may be characterized as an open-ended coaxial transmission line having a probe tip that is extendible beyond a coaxial dielectric. The probe tip may comprise a protruding conductor that may be shaped and sized to obtain a desired sensitivity to electric fields and/or radio frequency (RF) emissions, or to provide a RF desired transmission profile. A coaxial shield surrounds at least a portion of the probe tip. The relationship between the end of the tip that is closest to the device under test (DUT) and the end of the shield is dynamically reconfigurable to obtain a desired geometry of shield and probe tip. In one example, the shield may be translated in an axial direction in order to increase or decrease the length of probe tip extending beyond the shield. In another example, the probe tip may be translated axially in order to increase or decrease the length of probe tip extending beyond the shield.

The change in geometry of the probe tip and the shield may be selected to obtain a desired probe resolution and/or area of coverage. For example, the probe tip may be configured to receive RF emissions from a limited area of the DUT. The probe tip may also be used as a transmission antenna to transmit RF frequency into an area of the DUT to test immunity of the DUT to interference.

The resolution of a scanning system employing a reconfigurable coaxial probe may be changed by altering probe tip geometry without changing the vertical distance from the DUT. This enables automated testing of devices using a fixed probe that can test a variety of regions and areas of a DUT, and without affecting calibration and accuracy of the probe system. Moreover, specific hot spots radiating higher electromagnetic energy may be identified and examined with finer resolution through automated reconfiguration of the probe.

The shield and/or probe tip elements may be moved using stepping motors, hydraulic actuators, solenoids, or any suitable mechanism. A control system may be employed to detect actual position of the shield and/or the probe tip. The control system may use any suitable optical, electromagnetic, resistive, capacitive or other transducer to determine location and extension of the shield and/or probe tip.

FIG. 1 is a block schematic illustrating a test and measurement system 100 used to measure electric fields and/or electromagnetic radiation produced by a device under test (DUT) 102 in accordance with certain aspects of the invention. DUT 102 may be provided on a carrier 104, such as a circuit board or chip carrier that may, in some embodiments, be adapted for test purposes. In some embodiments, electric fields and/or electromagnetic radiation may be measured before a device on a semiconductor wafer is diced into individual ICs. One or more other devices 106 and 108 may be present on carrier 104, whereby devices 106 and 108 may comprise discrete components such as resistors, inductors and capacitors, solid state devices including semiconductor ICs, and/or connectors or other components commonly found in electronic devices.

A near-field electric probe 110 may be used for on-chip, on-carrier and/or on-package EMC analysis. In the example, probe 110 may be mounted on a mount or platform 114 that facilitates controlled translation of probe 110 relative to the DUT 102. Mount or platform 114 may be controlled by an industrial control or other computer or processing system, and the probe 110 may be positioned automatically according to a predetermined test plan or program. Probe 110 may also be positioned manually by an operator. An optical sensor 112, such as an imaging device, a camera, or other position sensor may be used to determine the position of the DUT relative to the probe 110, features of the DUT and/or features of carrier 104, or devices 106 and 108 to enable optical feedback to a positioning control system and/or operator. In some embodiments, image information provided by optical sensor 112 may be used to produce a composite image showing physical features of the DUT 102 and electric field measurements in relation to such physical features.

Conventional systems are generally limited to performing measurements using simple translations of probe 110. The probe 110 may have a pointed tip that is sensitive to field strength emanating from an area of the DUT 102. The area measured is typically a circular area (spot) characterized by a spot size which may be expressed in geometric terms as a radius, diameter and/or area affecting measured field strength at the probe tip. The size of the spot can affect the sensitivity and resolution of the near-field electric probe 110. Conventional systems change imaging resolution of optical sensor (e.g. a camera) 112 and spot size by changing vertical distance between probe 110 and DUT 102. It can be difficult for conventional systems to control its imaging resolution or spot size on the fly because moving the optical sensor 112 and probe 110 can change the electromagnetic characteristics of the test environment by, for example, introducing a ground plane or parasitic interferences when the EMC test system is moved. Moving the EMC test system entails vertical movement of the probe tip by mechanical means that may not have sufficient precision for use in electric field probing for high volume manufacturing, where high throughput is important and ease of repetition is needed.

Figure 2:
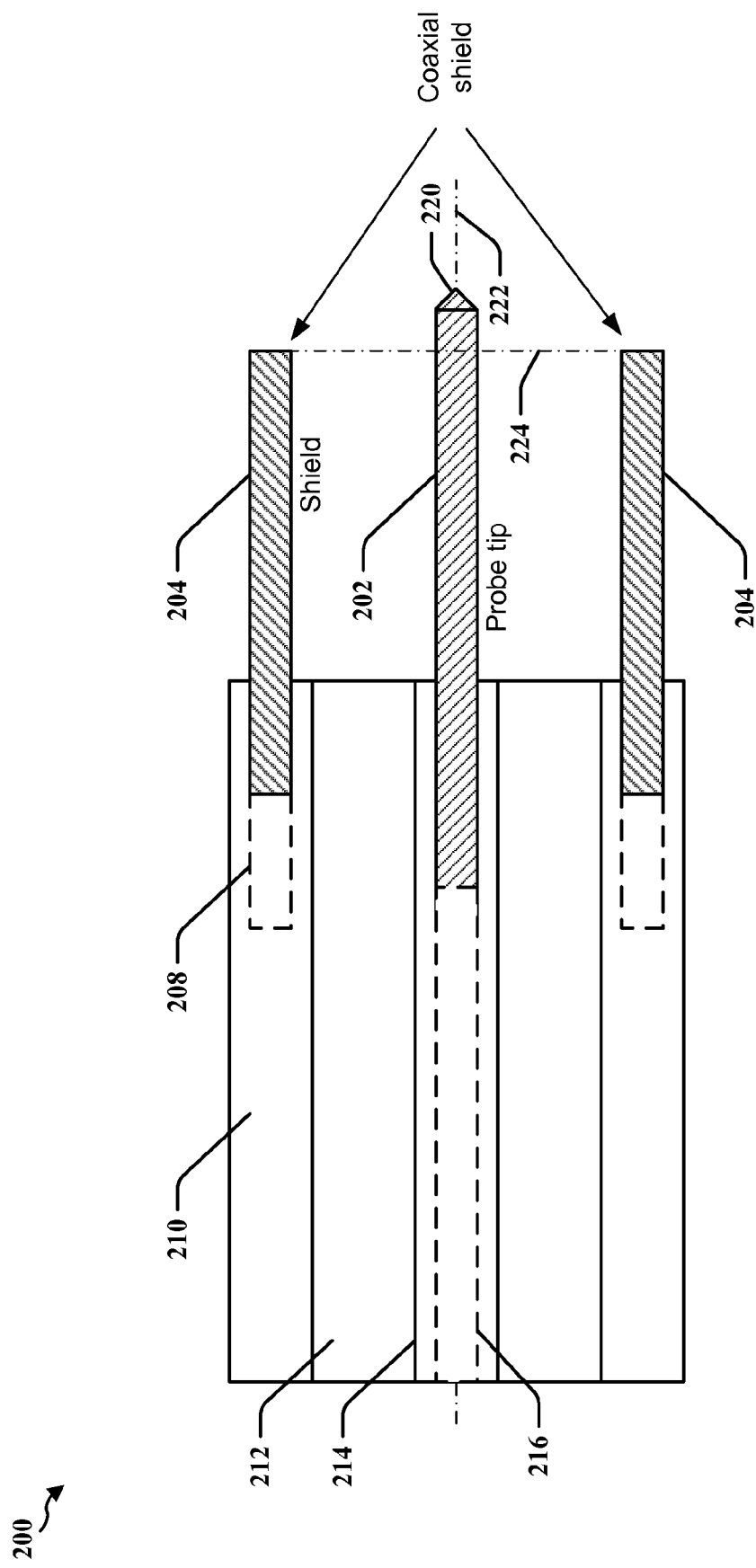
FIG. 2 is a simplified schematic illustrating a probe constructed according to certain aspects of the invention.

Certain embodiments of the present invention enable enhanced EMC test capabilities in both development and manufacturing environments through the use of an electrically reconfigurable probe tip. FIG. 2 is a simplified schematic drawing of a probe 200 constructed according to certain aspects of the invention. Probe 200 comprises an outer screen 210 coaxial with and surrounding a center conductor 214 that extends to form a probe tip 202. Probe tip 202 and screen 210 are typically formed from a conductive material, such as copper, silver, gold, platinum or other metal or conductive material. Screen 210 may comprise a material that blocks or impedes electromagnetic energy and/or fields. Probe 200 may also comprise a dielectric material 212 that serves as an insulator and is disposed as a layer between probe tip 202 and screen 210. Dielectric may be polymer, ceramic, or other insulator known the art as having desired dielectric properties. In some embodiments, dielectric layer 212 may be implemented using air, vacuum, an inert gas or other gas, and/or an insulating fluid.

The probe 200 may be adapted to permit reconfiguration of the geometry of the probe tip 202 and the screen 210, and/or the geometry of the probe tip 202 and an extension of the screen 210 that may comprise a cylindrical shield 204. In particular, the end or point 220 of probe tip 202 may be translated along the centre axis 222 of probe 200 such that the point 220 may selectively extend beyond the end of shield 204, recess within the volume of shield 204, or be in planar alignment with the base of the cylinder defined by shield 204 and indicated by dotted line 224.

In some embodiments, the geometry of the probe tip 202 and the shield 204 may be reconfigured by moving at least one of the probe tip 202 and the shield 204. Adjustment of the probe tip geometry can be used to modify the spot size and thereby easily control imaging resolution. An adjustable probe tip 202 and/or adjustable shield 204 may be mechanically or electromechanically actuated to control spot size and/or resolution of electric field measurements without changing the vertical distance between DUT and the imaging device 112, mount or platform 114 or other component of test and measurement system 100 shown in FIG. 1. An adjustable shield 204 may be mechanically or electromechanically actuated to control spot size and/or resolution of electric field measurements without changing the vertical distance between DUT and the probe tip 202. An adjustable probe tip 202 may be mechanically or electromechanically actuated to control spot size and/or resolution of electric field measurements without changing the vertical distance between DUT and the shield 204.

Figure 3:
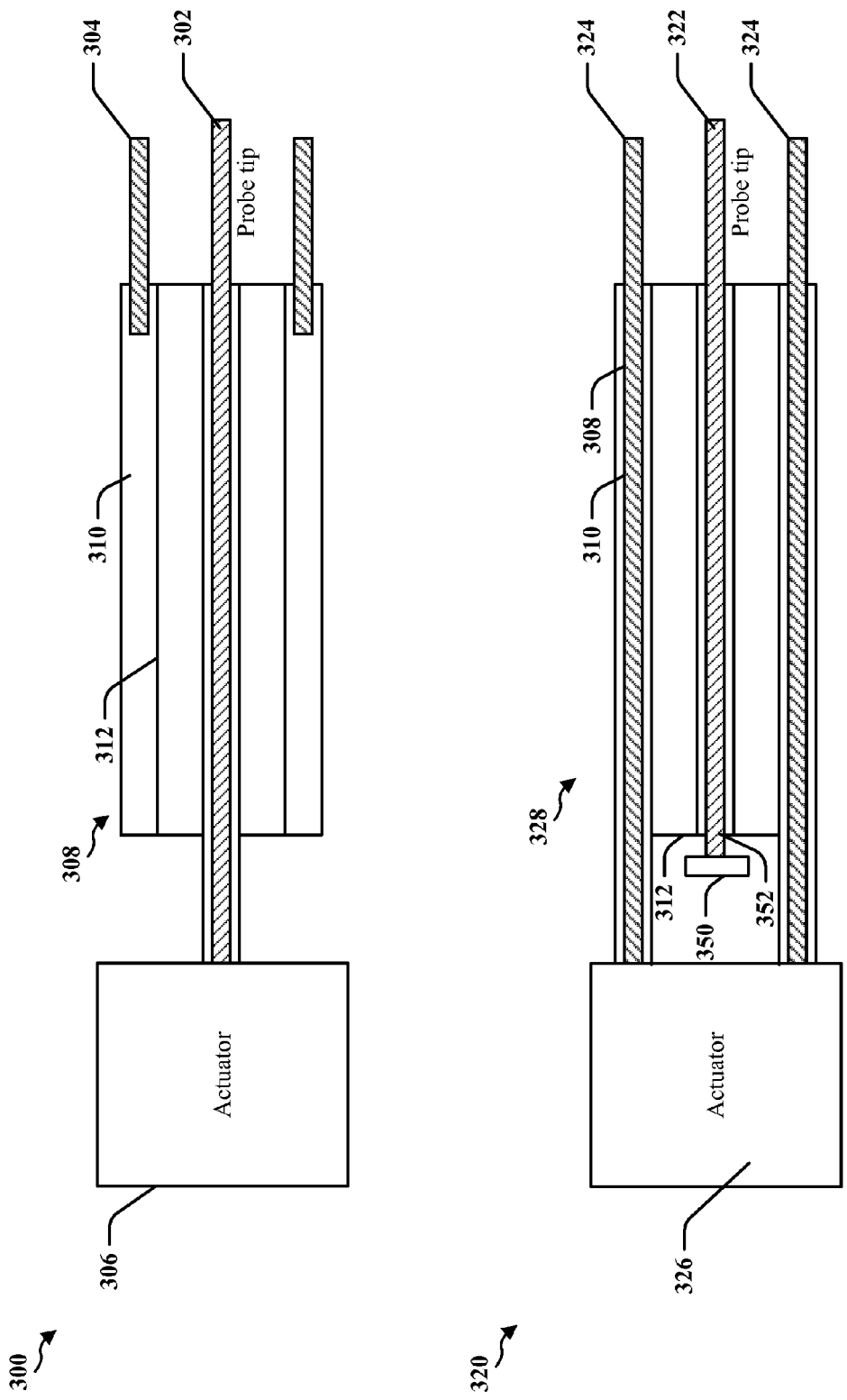
FIG. 3 includes simplified schematics illustrating probes constructed according to certain aspects of the invention.

FIG. 3 illustrates example probe systems 300 and 320 that can be used to control the effective area of the probe tip 302 or 322 by manual, computer-controlled and/or automatic modification of probe tip geometry. The arrangement of the actuator 306, 326 and the probes 308, 328 in the drawing 300 are not intended to reflect the physical location of these elements and/or other elements that may be used in certain configurations. Probe tips 302 and 322 may be formed as an extension of a center conductor or can be a conducting element coupled to, and serving as at least a portion of the center conductor. Probe tips 302 and 322 may be manufactured specifically for EMC testing. Similarly, shield 324 may be an extension of a shield 310 that extends along at least a portion of probe 308 or 328, or a separate extension 304 may be electromagnetically and/or electrically coupled to shield 310.

Figure 4:
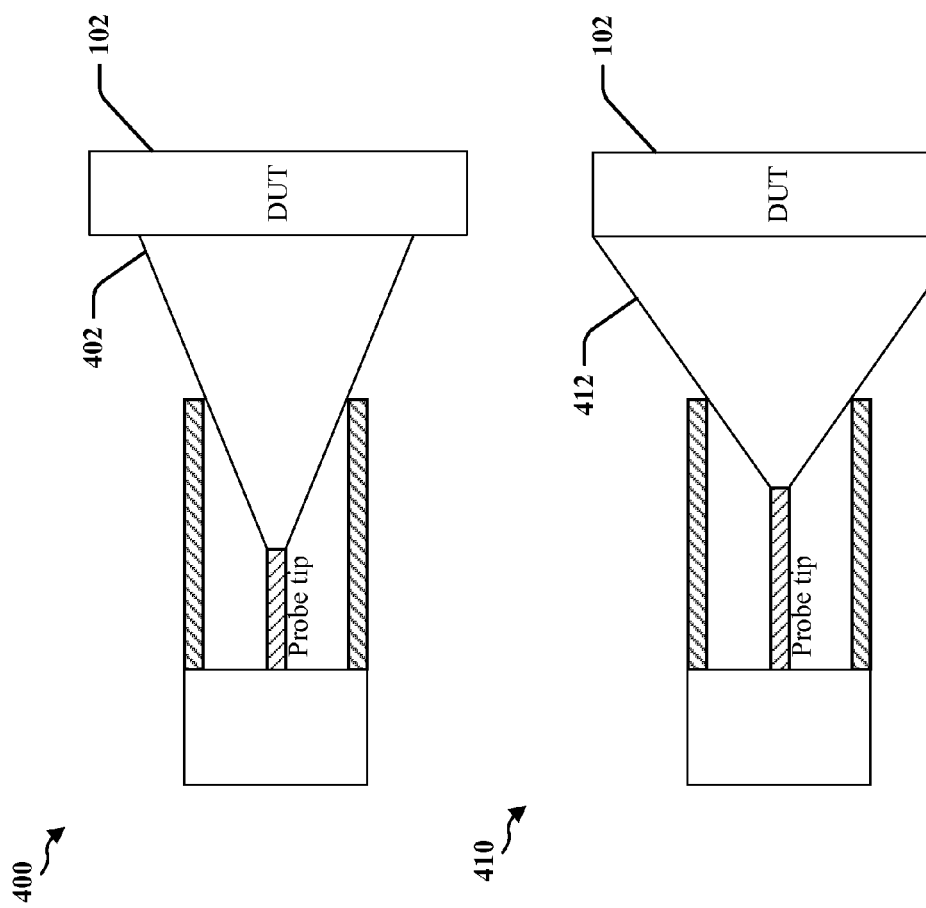
FIG. 4 depicts certain operational aspects of a probe according to certain aspects of the invention.

In one example, system 300 comprises a center conductor that has a probe tip 302 that is exposed to an outer electric field. Probe sensitivity or spot size may be controlled by adjusting the length of the protruding probe tip 302. The length of the probe tip 302 may be controlled using an electromechanical, mechanical, hydraulic, electromagnetic, magnetic, electrostatic or other actuator 306. Actuator 306 may comprise one or more solenoids, stepping motor, electric motor, etc. The resolution may be proportional to the length or to the area of the center conductor exposed to an impinging electromagnetic field emitted from DUT or other EMC source. In some embodiments, retraction or extension of the probe tip 302 relative to the shield 304 defines a lobe, or cone 402 and 412 of electromagnetic influence, as illustrated in the simplified examples of probe configurations 400 and 410 shown in FIG. 4.

In another example, system 320 comprises a center conductor that has a probe tip 322 that is fixed and exposed to an outer electric field. Probe sensitivity or spot size may be controlled by adjusting the outer sleeve or shield 324 to control the probe resolution of the probe tip 322. The shield 324 may be extended using an electromechanical, mechanical, hydraulic, electromagnetic, magnetic, electrostatic or other actuator 326. Actuator 326 may comprise one or more solenoids, stepping motor, electric motor, etc. The resolution may be proportional to the length or to the area of the center conductor exposed to an impinging electromagnetic field emitted from DUT 102 or other EMC source.

Some embodiments employ an actuated probe tip 302 and an actuated shield 324. The position of tip 302 may be adjusted to increase or decrease sensitivity while the shield 324 is adjusted to "focus" on a selected area of the DUT 102 or to obtain increased or decreased resolution. In some embodiments, the geometry of shield 324 may be adjusted to provide a shield that comprises one or more portions that can be cylindrical, conical, frustoconical, parabolic, elliptical, hyperbolic, etc. Accordingly the probe 308 and/or 328 can select areas of interest, and can adjust resolution and sensitivity on the fly by changing only the distance of one or more of the probe tip 302 and/or shield 324 from the DUT 102.

Accordingly, the need for moving more massive components during testing can be eliminated, thereby improving speed of testing and repeatability and consistency of the systems. Furthermore, the mechanical structure of a near field electric probe system can be significantly reduced and scanning time can be reduced while efficiency is increased to a degree that the EMC measurement system can be more widely deployed in production lines.

In certain embodiments, a probe (e.g. probe 200, 308, or 328) may be used to test a DUT 102 for tolerance to externally produced electric fields, EMI or electrostatic discharge (ESD). A voltage and/or charge may be developed on probe tip 202, 302 or 322 after the probe tip has been positioned within a desired distance from DUT 100 or an area of interest on DUT 100. Shield 204, 304, or 324 may be adjusted to limit the area influenced by the voltage or charge present on probe tip 202, 302 or 322. The effects of an electric field thus developed may be measured by observing the performance and/or failure of the DUT 100. In some embodiments, an ESD event may be triggered to test the ability of DUT 100 to withstand the resultant current surge or voltage spike. In some embodiments, an RF emission from probe tip 202, 302 or 322 by providing a signal to the center conductor (e.g. conductor 352 of FIG. 3) through a terminal such as terminal 350.

Figure 5:
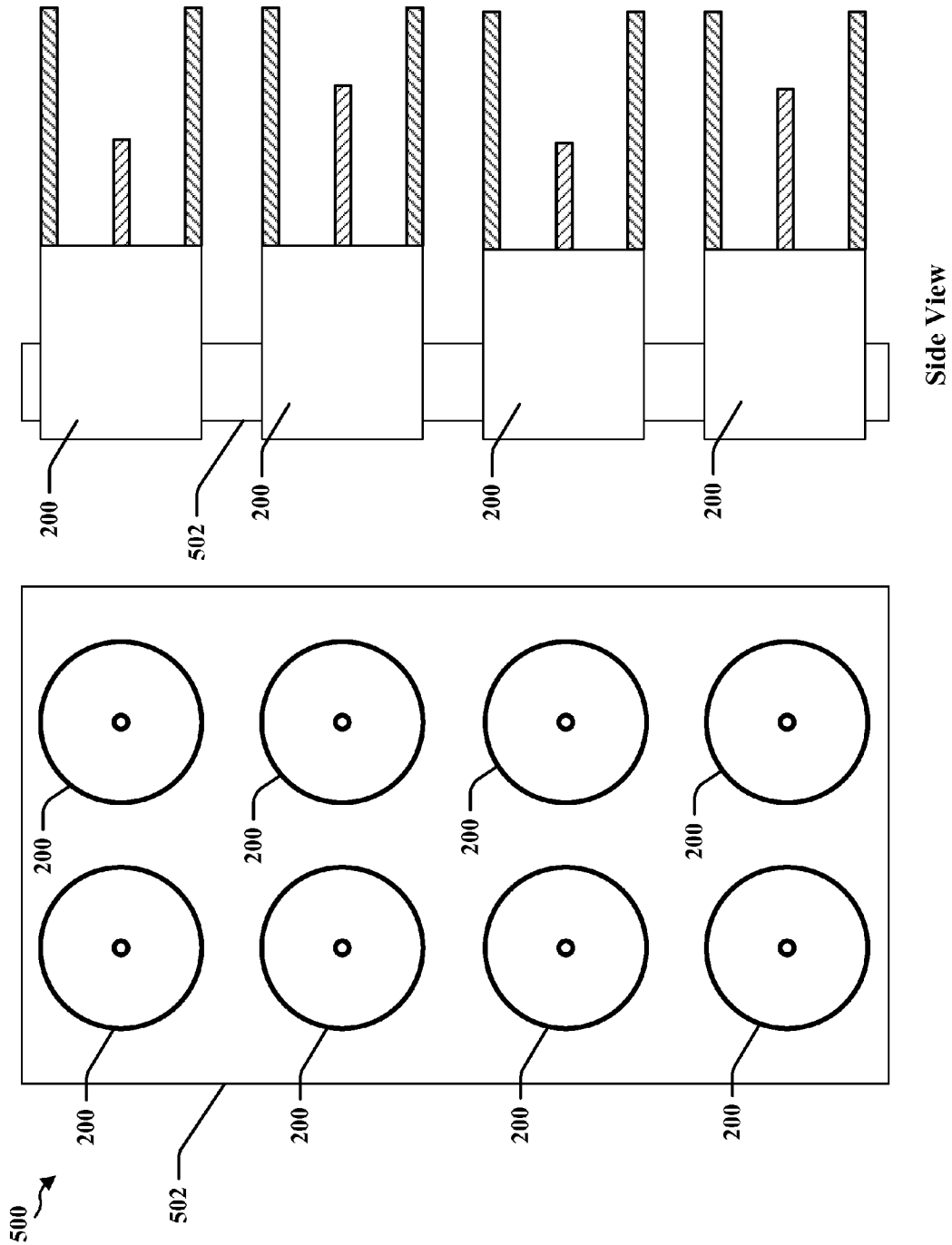
FIG. 5 is a simplified schematic illustrating an array of probes constructed according to certain aspects of the invention.

FIG. 5 depicts a near-field electric probe system 500 in which multiple probes 200 are provided on a single platform 502. The tip and/or shield of each probe 200 may be independently controlled to enable simultaneous testing of multiple DUTs 102 or different areas of interest on one or more DUT 102. The positioning of the shields of probes 200 and/or probe tips of probes 100 may be controlled by computer or by an operator using an electromechanical, mechanical, hydraulic, electromagnetic, magnetic, electrostatic actuator or other suitable actuator. In one example, the tip and/or shield of each probe may be controlled by one or more micro-electromechanical systems (MEMS). In another example, the tip and/or shield of each probe may be controlled by one or more stepping motors.

Certain embodiments provide an EMC, EMI and/or ESD probe. The probe may be housed in a substantially cylindrical housing, although the housing may have any shape. Some embodiments have no external housing and some embodiments have an electromagnetic insulation layer. The probe may comprise a center conductor extending along an axis of the EMC probe and the center conductor may have a probe tip at one end. The probe may comprise a screen and/or a shield coaxially aligned with the center conductor. The shield and/or screen may be configured to provide electromagnetic screening for the probe tip. The probe may comprise and/or be coupled to one or more actuators.

One or more of the actuators may be configured to axially translate the probe tip or the shield and thereby change the position of the probe tip relative to the shield. An actuator may be configured to move the probe tip along the axis of the probe such that a first distance measured between the probe tip and a DUT is changed while a second distance measured between the shield and the DUT remains unchanged. An actuator may be configured to move the shield in a direction parallel to the center conductor. Actuators may move one or more of the shield and the probe tip without moving the other component. The probe tip and/or shield may be moved such that their respective distances to the DUT is changed.

The probe may be adapted to detect an electric field proximate to an area of interest on a surface of the DUT, to create an electric field proximate to an area of interest on a surface of the DUT, to measure electromagnetic radiation detected by the probe tip, to transmit electromagnetic radiation through the probe tip and/or to generate and ESD event proximate to an area of interest on a surface of the DUT. Electromagnetic radiation and electric fields may emanate from the area of interest and may be generated or transmitted through the area of interest.

Probe sensitivity, and field generation and/or transmission power may be controlled to some degree by selecting the distance between the probe tip and the DUT. The shield may be extended or retracted to expose the probe tip to a greater or lesser area of the DUT.

In some embodiments, actuators are controlled by a computing device. Actuators may comprise an electromechanical actuator, a hydraulic actuator, an electrostatic actuator, a solenoid, or a MEMS device. MEMS devices may be used when probes are constructed on an integrated circuit.

Probes may be collocated and arranged in an array or geometric pattern. Two or more probes may cooperate in testing an area of the DUT. Different collocated probes may target different areas of a DUT. Collocated probes may be provided on a semiconductor or other IC device or substrate that comprises MEMS actuators.

The DUT may comprise a semiconductor device or a non-semiconductor device, an IC, a discrete circuit element, an antenna. In some embodiments, the DUT may comprise a complete or partial circuit board and/or a fully constructed device, such as a keyboard, a display, a cellular mobile device, a router, a computer, etc.

Figure 6:
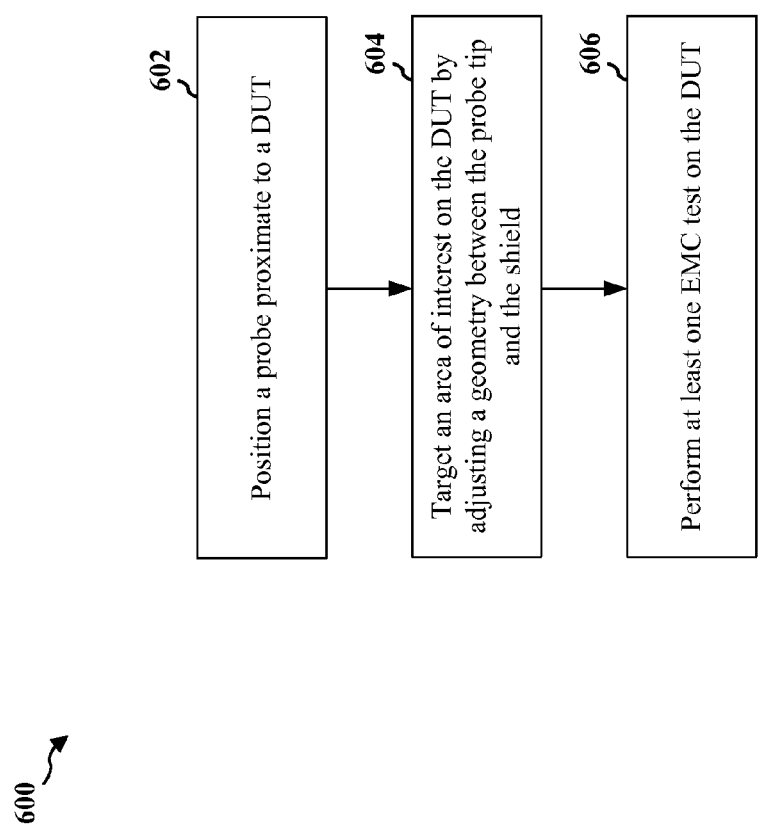
FIG. 6 is a flow chart of a method according to certain aspects of the invention.

FIG. 6 is a flow chart 600 of a method of operation of a near-field electric probe system. The method may be performed by a computing device or system that includes one or more processors, storage and input/output devices used to control actuators and obtain measurements from sensors, such as voltage sensors, RF power meters, etc.

At step 602, a probe 200 is positioned proximate to a DUT 102, wherein the probe 200 comprises a center conductor 214 extending along an axis 222 of the probe and having a probe tip 202 at one end and a shield 204 and/or screen 210 coaxially aligned with the center or axial conductor 214 and configured to provide electromagnetic screening for the probe tip 202. Probe tip 202 may have a shaped end 220 (such as a pointed end). Probe tip 202 may be translated along a recess, channel, tunnel or hole 216 or conductor 214. Shield 204 may be moved or translated at least partially within a groove, recess, or slot of screen 210.

At step 604 an area of interest on the DUT 102 is targeted by adjusting a geometry between the probe tip 202 and the shield 204. Targeting the area of interest may include selecting the extent of the area of interest. The area of interest may extend over a portion of DUT 102, the complete DUT 102, at least a portion of the DUT 102 and surrounding devices 106, 108 and/or carrier 104. The location of the shield 204 may be adjusted to electromagnetically screen the probe tip 102 from electrical fields emanating outside the area of interest and/or to confine fields and radiation produced at the tip 102 to a desired area of interest on the DUT 102. The shield 204 may be adjusted by moving the shield in a direction parallel to the axial conductor 214. Sensitivity of the probe may be adjusted by axially translating the probe tip 202 and/or the shield 204 and thereby changing the position of the probe tip relative to the shield and/or the amount of radiation received or electric field detected by the probe tip 202.

In some embodiments, one or more actuators 306, 326 are controlled to select the geometry between the probe tip 302, 322 and the shield 304, 324, wherein each of the one or more actuators 306, 326 is operative to move the shield 304, 324 in the direction parallel to the axial conductor, or is operative to axially translate the probe tip 302, 322. The one or more actuators 306, 326 comprise one or more of an electromechanical actuator, a hydraulic actuator, an electrostatic actuator, and a solenoid.

At step 606, at least one EMC test is performed on the DUT 102. The at least one EMC test may comprise measuring an electric field proximate to the area of interest, creating an electric field proximate to the area of interest, measuring an electromagnetic radiation emanating from the area of interest, transmitting electromagnetic radiation toward the area of interest, and/or creating an electrostatic discharge event proximate to the area of interest.

Figure 7:
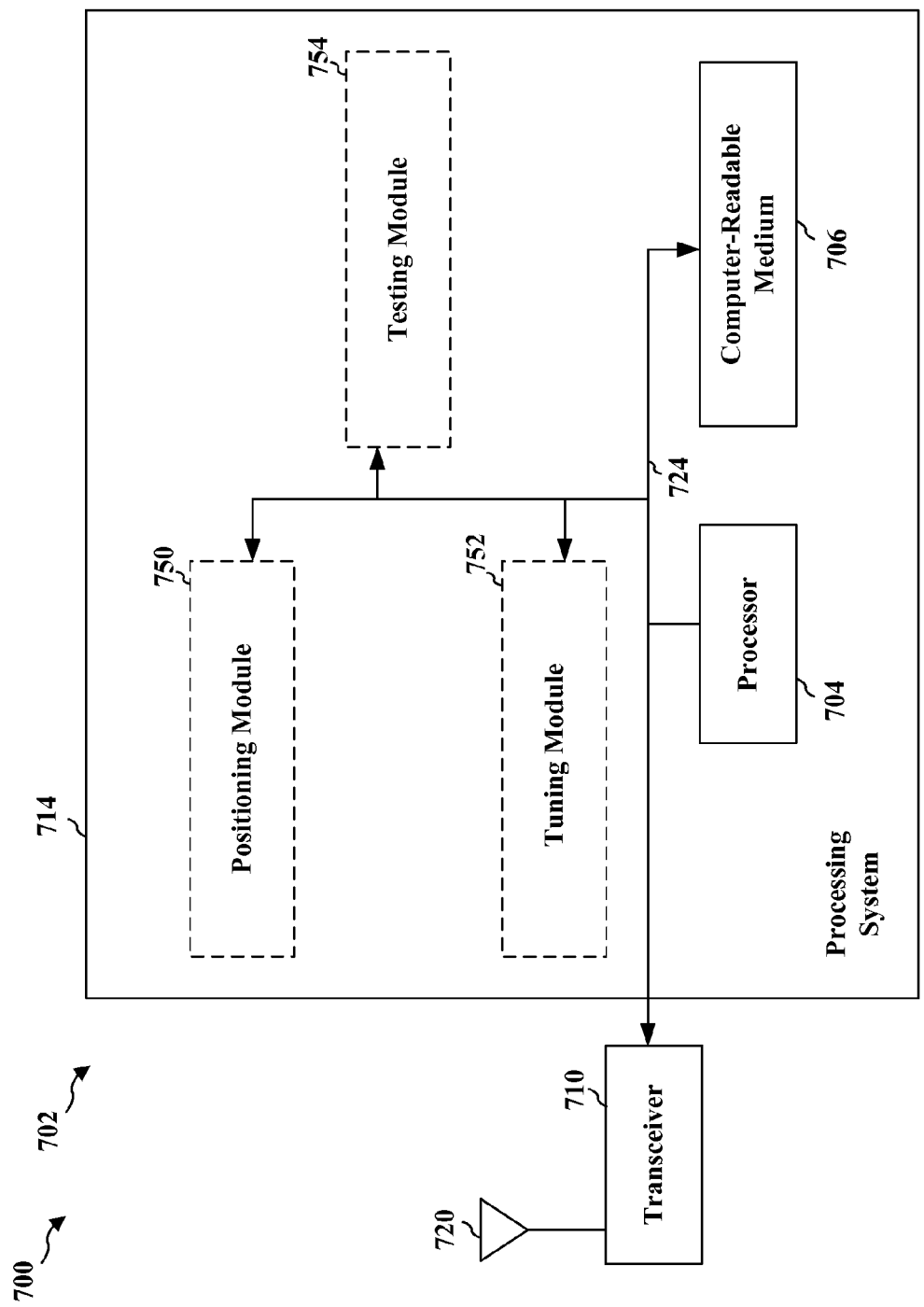
FIG. 7 illustrates a processing system employed in certain embodiments of the invention.

FIG. 7 is a diagram 700 illustrating an example of a hardware implementation for an apparatus 702 employing a processing system 714. The processing system 714 may be implemented with a bus architecture, represented generally by the bus 724. The bus 724 may include any number of interconnecting buses and bridges depending on the specific application of the processing system 714 and the overall design constraints. The bus 724 links together various circuits including one or more processors and/or hardware modules, represented by the processor 704, the modules 750, 752, 754, and the computer-readable medium 706. The bus 724 may also link various other circuits such as timing sources, peripherals, voltage regulators, and power management circuits, which are well known in the art, and therefore, will not be described any further.

The processing system 714 may be coupled to a transceiver 710. The transceiver 710 is coupled to one or more antennas 720 or to a wired network. The transceiver 710 provides a means for communicating with various other apparatus over a transmission medium. The processing system 714 includes a processor 704 coupled to a computer-readable medium 706. The processor 704 is responsible for general processing, including the execution of software stored on the computer-readable medium 706. The software, when executed by the processor 704, causes the processing system 714 to perform the various functions described supra for any particular apparatus. The computer-readable medium 706 may also be used for storing data that is manipulated by the processor 704 when executing software. The processing system further includes at least one of the modules 750, 752, and 754. The modules may be software modules running in the processor 704, resident/stored in the computer readable medium 706, one or more hardware modules coupled to the processor 704, or some combination thereof.

In one configuration, the apparatus 702 includes modules or means 750 for positioning a probe proximate to a DUT, tuning modules or means 752 for adjusting probe sensitivity for and for targeting an area of interest on the DUT by adjusting a geometry between the probe tip and the shield, and modules or means 754 for performing at least one EMC test on the DUT.

Means may be one or more of the aforementioned modules of the apparatus 702 and/or the processing system 714 of the apparatus 702 configured to perform the functions recited by the aforementioned means. Computer-readable medium may comprise non-volatile storage that maintains instructions and data that, when executed by processor 704, cause the apparatus 714 to perform one or more steps of the methods and processes described herein.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. A method for electromagnetic compatibility (EMC) testing, comprising:
    positioning a probe proximate to a device under test (DUT), wherein the probe comprises a center conductor extending along an axis of the probe and having a probe tip at one end and a shield coaxially aligned with the center conductor and configured to provide electromagnetic screening for the probe tip;
    targeting an area of interest on the DUT by adjusting a geometry between the probe tip and the shield; and
    performing at least one EMC test on the DUT, wherein adjusting the geometry between the probe tip and the shield comprises moving the shield in a direction parallel to the center conductor.

2. The method of claim 1, wherein targeting the area of interest includes selecting an extent of the area of interest and adjusting the shield to electromagnetically screen the probe tip from electrical fields outside the area of interest.

3. The method of claim 1, further comprising adjusting sensitivity of the probe by axially translating the probe tip or the shield and thereby change the position of the probe tip relative to the shield.

4. The method of claim 1, further comprising controlling one or more actuators to select the geometry between the probe tip and the shield, wherein each of the one or more actuators is operative to move the shield in the direction parallel to the center conductor, or is operative to axially translate the probe tip.

5. The method of claim 4, wherein the one or more actuators comprises one or more of an electromechanical actuator, a hydraulic actuator, an electrostatic actuator, and a solenoid.

6. The method of claim 1, wherein performing the at least one EMC test comprises measuring an electric field proximate to the area of interest.

7. The method of claim 1, wherein performing the at least one EMC test comprises creating an electric field proximate to the area of interest.

8. The method of claim 1, wherein performing the at least one EMC test comprises measuring an electromagnetic radiation emanating from the area of interest.

9. The method of claim 1, wherein performing the at least one EMC test comprises transmitting electromagnetic radiation toward the area of interest.

10. An apparatus for electromagnetic compatibility (EMC) testing, comprising:
    means for positioning a probe proximate to a device under test (DUT), wherein the probe comprises a center conductor extending along an axis of the probe and having a probe tip at one end and a shield coaxially aligned with the center conductor and configured to provide electromagnetic screening for the probe tip;
    means for targeting an area of interest on the DUT by adjusting a geometry between the probe tip and the shield; and
    means for performing at least one EMC test on the DUT, wherein adjusting the geometry between the probe tip and the shield comprises moving the shield in a direction parallel to the center conductor.

11. The apparatus of claim 10, wherein the means for targeting the area of interest selects an extent of the area of interest and adjusts the shield to electromagnetically screen the probe tip from electrical fields outside the area of interest.

12. The apparatus of claim 10, further comprising means for adjusting sensitivity of the probe by axially translating the probe tip or the shield and thereby change the position of the probe tip relative to the shield.

13. The apparatus of claim 10, further comprising means for controlling one or more actuators to select the geometry between the probe tip and the shield, wherein each of the one or more actuators is operative to move the shield in the direction parallel to the center conductor, or is operative to axially translate the probe tip.

14. The apparatus of claim 13, wherein the one or more actuators comprises one or more of an electromechanical actuator, a hydraulic actuator, an electrostatic actuator, and a solenoid.

15. The apparatus of claim 10, wherein the means for performing at least one EMC test measures an electric field proximate to the area of interest.

16. The apparatus of claim 10, wherein the means for performing at least one EMC test creates an electric field proximate to the area of interest.

17. The apparatus of claim 10, wherein the means for performing at least one EMC test measures an electromagnetic radiation emanating from the area of interest.

18. The apparatus of claim 10, wherein the means for performing at least one EMC test transmits electromagnetic radiation toward the area of interest.

19. An apparatus for electromagnetic compatibility (EMC) testing, comprising:
a processing system configured to:
position a probe proximate to a device under test (DUT), wherein the probe comprises a center conductor extending along an axis of the probe and having a probe tip at one end and a shield coaxially aligned with the center conductor and configured to provide electromagnetic screening for the probe tip;
target an area of interest on the DUT by adjusting a geometry between the probe tip and the shield; and
perform at least one EMC test on the DUT, wherein adjusting the geometry between the probe tip and the shield comprises moving the shield in a direction parallel to the center conductor.

20. The apparatus of claim 19, wherein the processing system targets the area of interest by selecting an extent of the area of interest and adjusting the shield to electromagnetically screen the probe tip from electrical fields outside the area of interest.

21. The apparatus of claim 19, wherein the processing system is further configured to adjust sensitivity of the probe by axially translating the probe tip or the shield and thereby change the position of the probe tip relative to the shield.

22. The apparatus of claim 19, wherein the processing system is further configured to control one or more actuators to select the geometry between the probe tip and the shield, wherein each of the one or more actuators is operative to move the shield in the direction parallel to the center conductor, or is operative to axially translate the probe tip.

23. The apparatus of claim 22, wherein the one or more actuators comprises one or more of an electromechanical actuator, a hydraulic actuator, an electrostatic actuator, and a solenoid.

24. The apparatus of claim 19, wherein the processing system performs the at least one EMC test by measuring an electric field proximate to the area of interest.

25. The apparatus of claim 19, wherein the processing system performs the at least one EMC test by creating an electric field proximate to the area of interest.

26. The apparatus of claim 19, wherein the processing system performs the at least one EMC test by measuring an electromagnetic radiation emanating from the area of interest.

27. The apparatus of claim 19, wherein the processing system performs the at least one EMC test by transmitting electromagnetic radiation toward the area of interest.

28. A non-transitory computer program product, comprising:
a non-transitory computer-readable medium comprising code for:
positioning a probe proximate to a device under test (DUT), wherein the probe comprises a center conductor extending along an axis of the probe and having a probe tip at one end and a shield coaxially aligned with the center conductor and configured to provide electromagnetic screening for the probe tip;
targeting an area of interest on the DUT by adjusting a geometry between the probe tip and the shield; and
performing at least one EMC test on the DUT, wherein adjusting the geometry between the probe tip and the shield comprises moving the shield in a direction parallel to the center conductor.

29. The non-transitory computer program product of claim 28, wherein targeting the area of interest includes selecting an extent of the area of interest and adjusting the shield to electromagnetically screen the probe tip from electrical fields outside the area of interest.

30. The non-transitory computer program product of claim 28, further comprising code for adjusting sensitivity of the probe by axially translating the probe tip or the shield and thereby change the position of the probe tip relative to the shield.

31. The non-transitory computer program product of claim 28, further comprising code for controlling one or more actuators to select the geometry between the probe tip and the shield, wherein each of the one or more actuators is operative to move the shield in the direction parallel to the center conductor, or is operative to axially translate the probe tip.

32. The non-transitory computer program product of claim 31, wherein the one or more actuators comprises one or more of an electromechanical actuator, a hydraulic actuator, an electrostatic actuator, and a solenoid.

33. The non-transitory computer program product of claim 28, wherein performing the at least one EMC test comprises measuring an electric field proximate to the area of interest.

34. The non-transitory computer program product of claim 28, wherein performing the at least one EMC test comprises creating an electric field proximate to the area of interest.

35. The non-transitory computer program product of claim 28, wherein performing the at least one EMC test comprises measuring an electromagnetic radiation emanating from the area of interest.

36. The non-transitory computer program product of claim 28, wherein performing the at least one EMC test comprises transmitting electromagnetic radiation toward the area of interest.

* * * * *